(12) United States Patent
Webb et al.

(10) Patent No.: US 8,786,277 B2
(45) Date of Patent: Jul. 22, 2014

(54) ENVIRONMENTAL NOISE REDUCTION FOR MAGNETOMETRY

(75) Inventors: Michael L. Webb, Cerritos, CA (US); Aaron C. White, Rancho Palos Verdes, CA (US)

(73) Assignee: Raytheon Applied Signal Technology, Inc., Sunnyvale, CA (US)

( * ) Notice: Subject to any disclaimer, the term of this patent is extended or adjusted under 35 U.S.C. 154(b) by 524 days.

(21) Appl. No.: 13/170,015

(22) Filed: Jun. 27, 2011

(65) Prior Publication Data
US 2012/0326707 A1    Dec. 27, 2012

(51) Int. Cl.
    *G01R 33/02* (2006.01)
(52) U.S. Cl.
    USPC ...... 324/246; 324/207.12; 324/330; 324/331; 324/301; 324/303; 324/247; 324/345; 324/326; 324/557
(58) Field of Classification Search
    CPC .... G01R 33/007; G01R 33/025; G01R 33/02; G01R 33/0206; G01C 3/00; G01C 3/08; G01C 5/005; G01C 17/02
    USPC ......... 324/244, 330, 331, 246, 301, 303, 345, 324/557, 326, 247; 382/100, 108; 702/189, 702/5, 57
    See application file for complete search history.

(56) References Cited

U.S. PATENT DOCUMENTS

2009/0216451 A1*   8/2009   Barnes et al. .................. 702/5
2011/0181290 A1*   7/2011   Kuzmin et al. ............ 324/331

OTHER PUBLICATIONS

Polatomic Incorporated, "Interface Design Description for the Multi-Mode Magnetic Detection System", Contract No. N00014-03-C-0388, Document No. 0BSB2-03-C-0388-01, Revision I, Nov. 21, 2008.

* cited by examiner

*Primary Examiner* — Arleen M Vazquez
*Assistant Examiner* — Son Le
(74) *Attorney, Agent, or Firm* — Christie, Parker & Hale, LLP

(57) ABSTRACT

A magnetic signal noise reduction and detection system has inputs configured to receive data from a first total field scalar magnetometer, data from a vector magnetometer, and data from a position, velocity and heading sensor, a signal processor configured with a pre-processor system, an adaptive noise cancellation system and a detection system, the pre-processor system configured to carry out initial processing of data received. The pre-processor is configured to convert data to the frequency domain and pass the converted data to the adaptive noise cancellation system. The adaptive noise cancellation system is configured to carry out multivariate regression on the converted data to reduce detected noise. The detection system is configured to detect magnetic anomalies and output information in real time about the magnetic anomalies to a user interface.

19 Claims, 19 Drawing Sheets

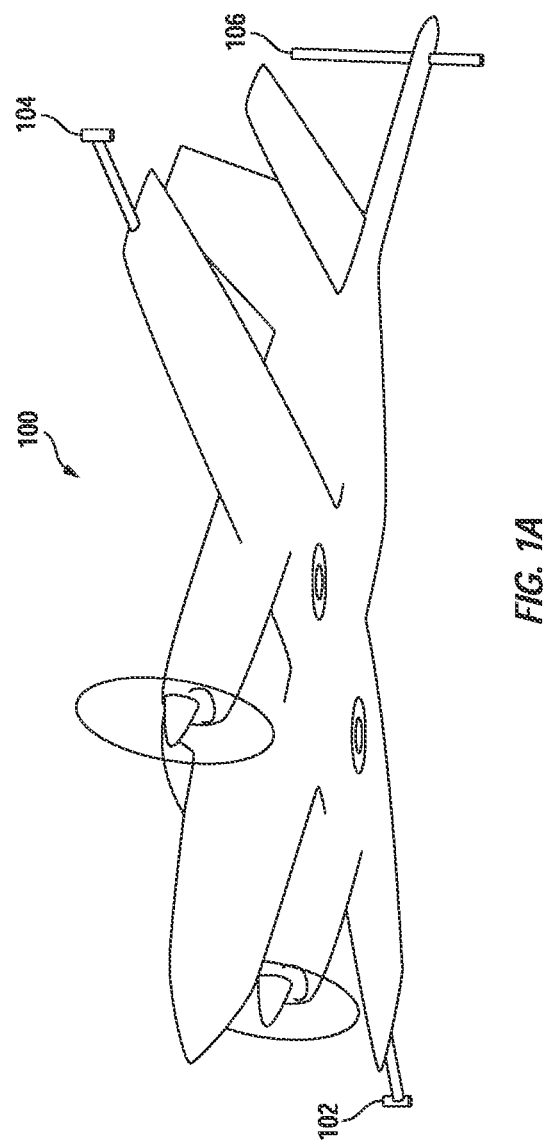

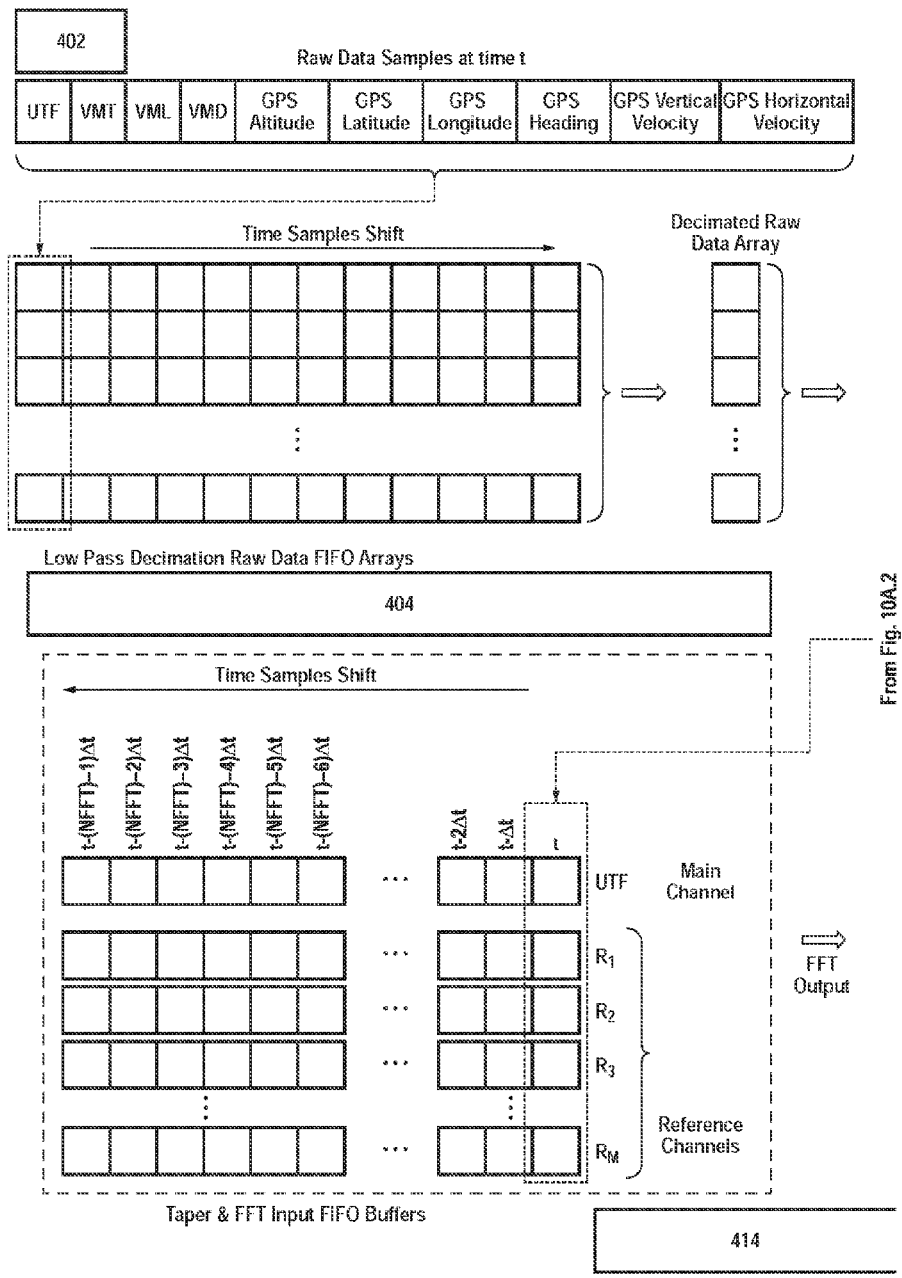
FIG. 10A.1

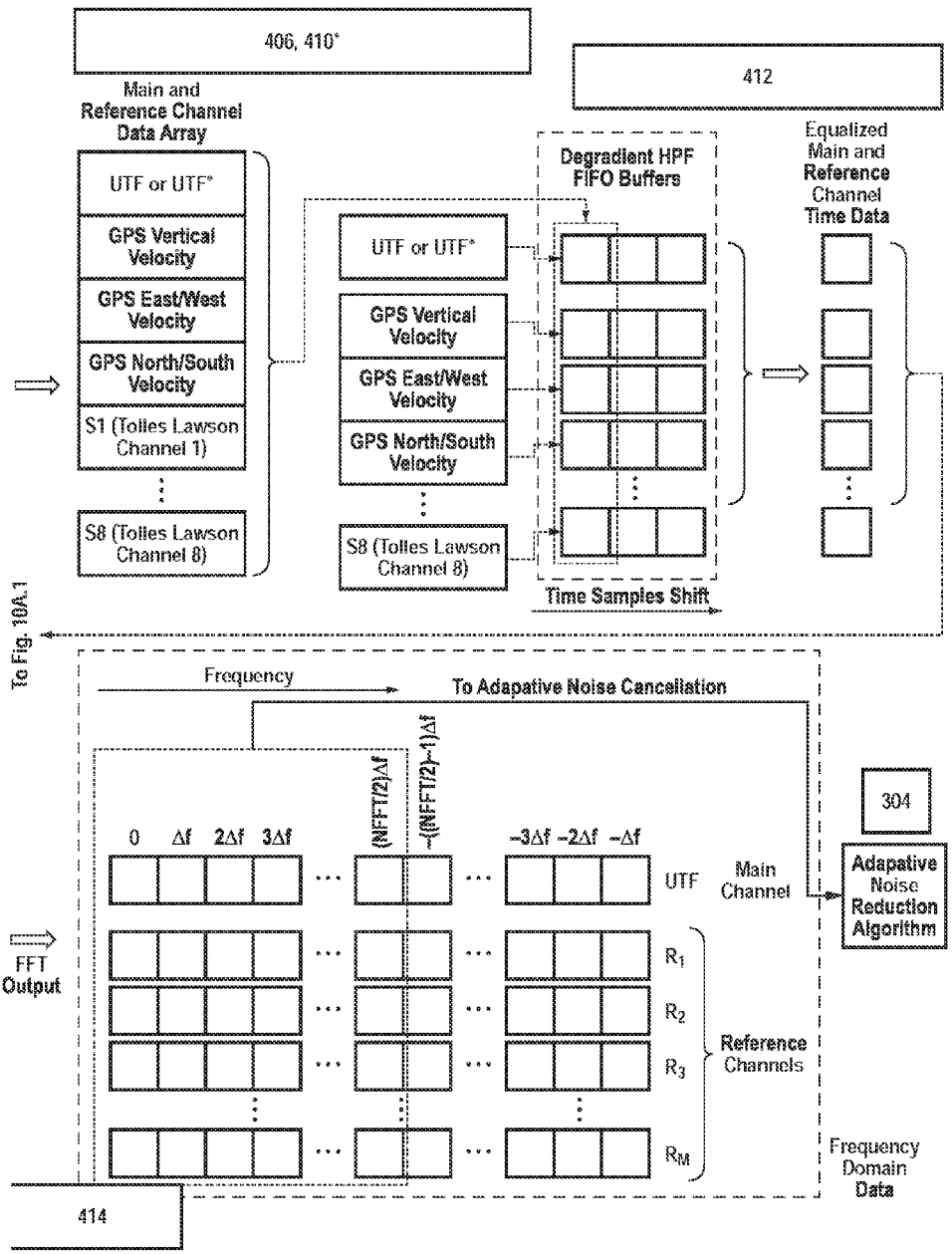
FIG. 10A.2

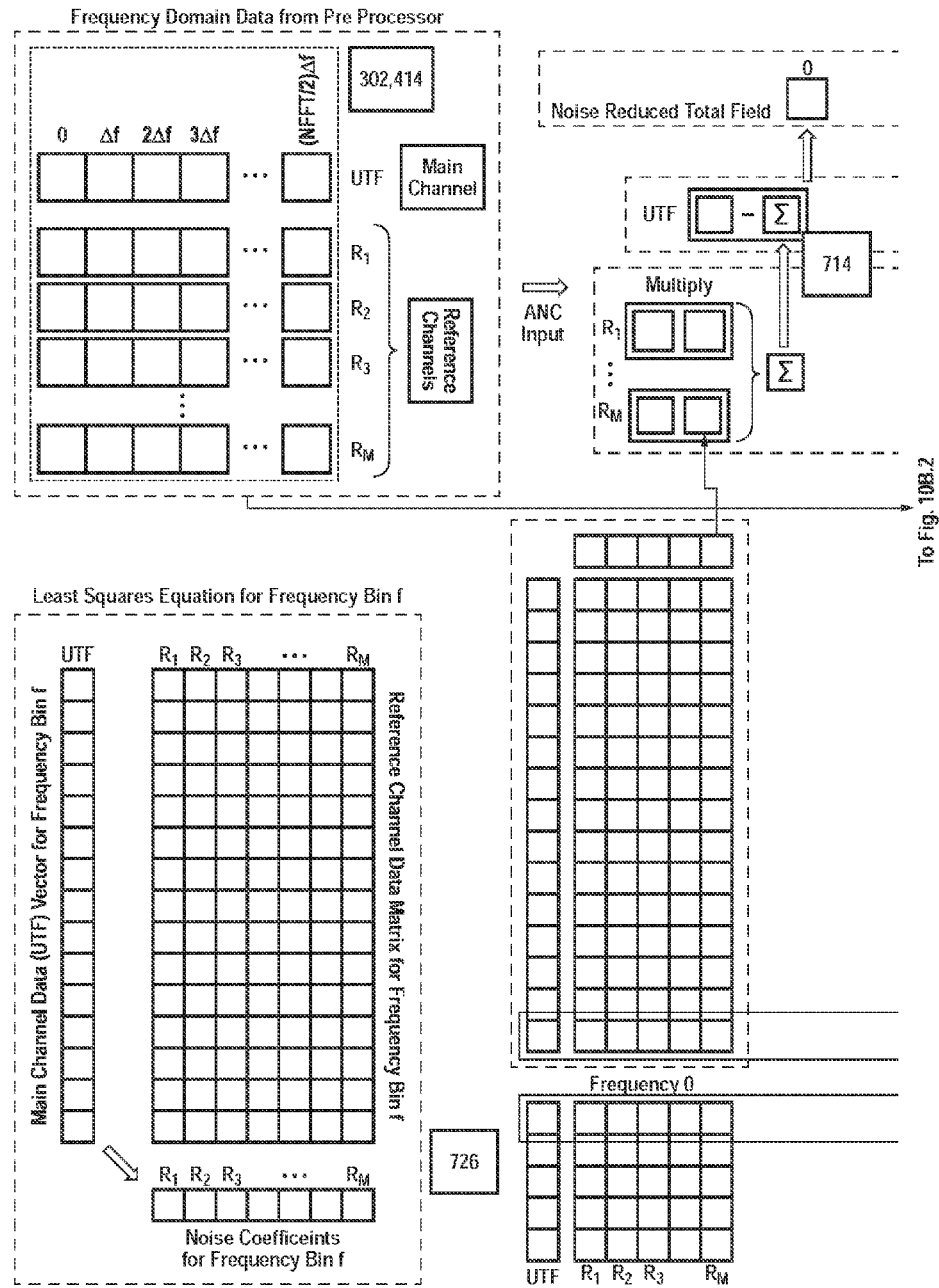
FIG. 10B.1

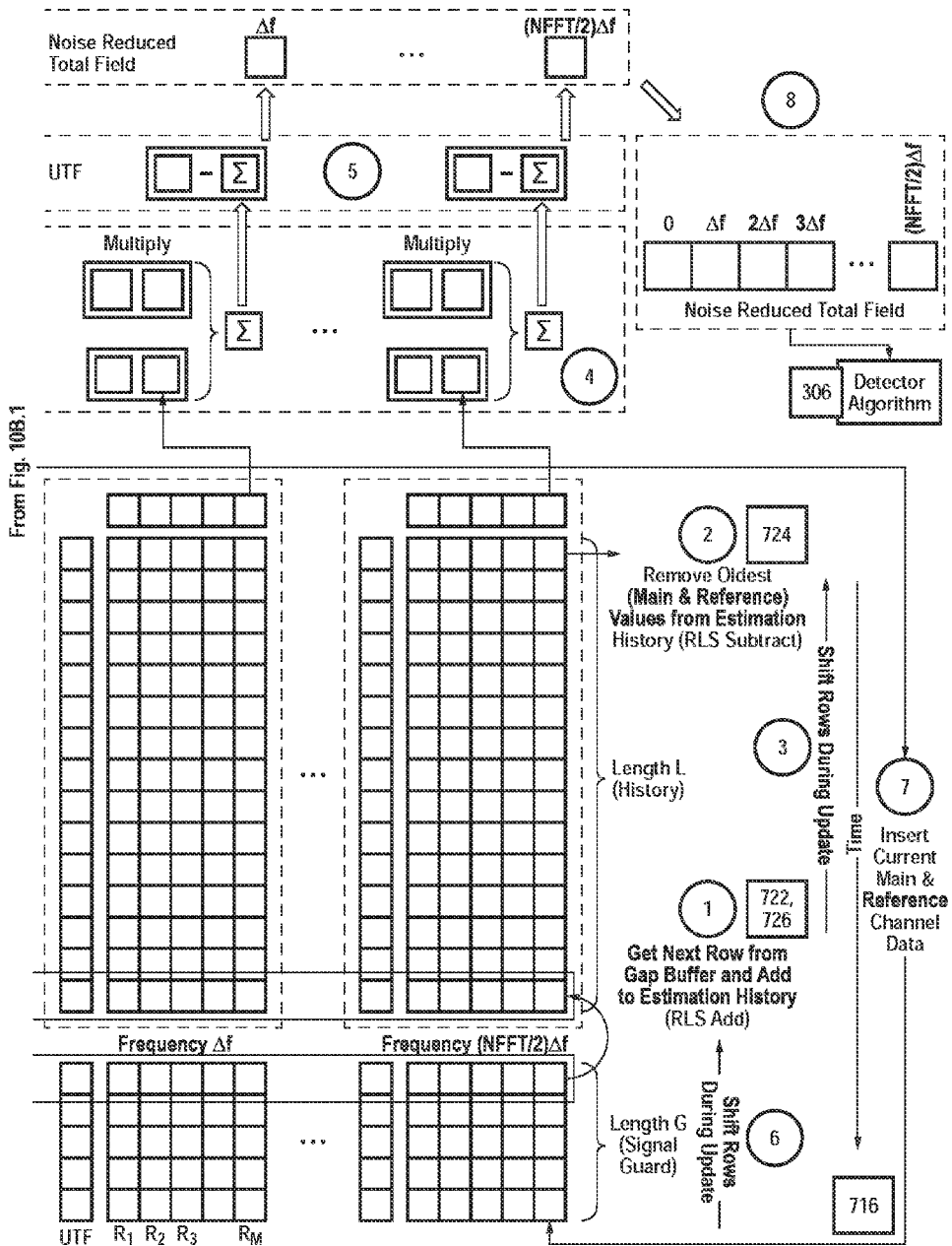
FIG. 10B.2

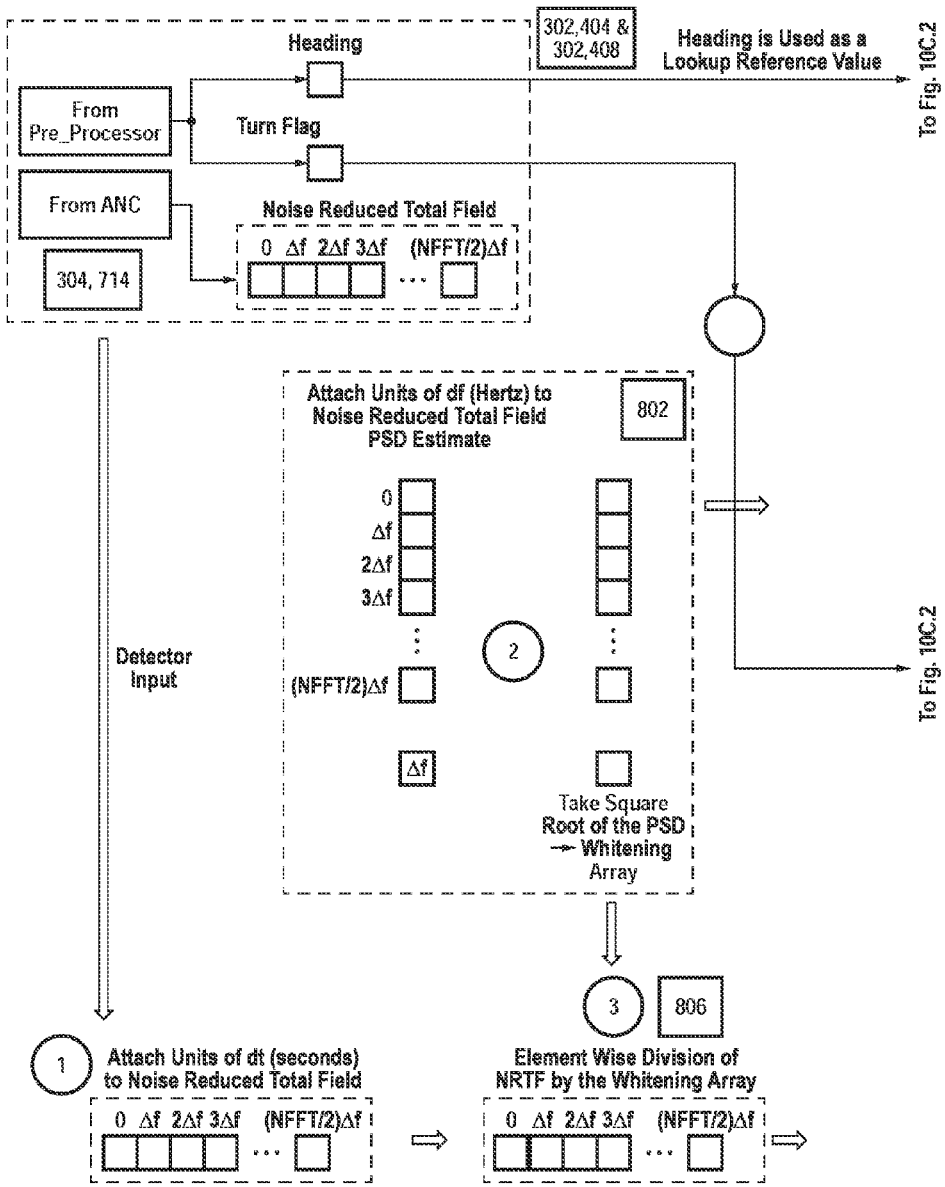
FIG. 10C.1

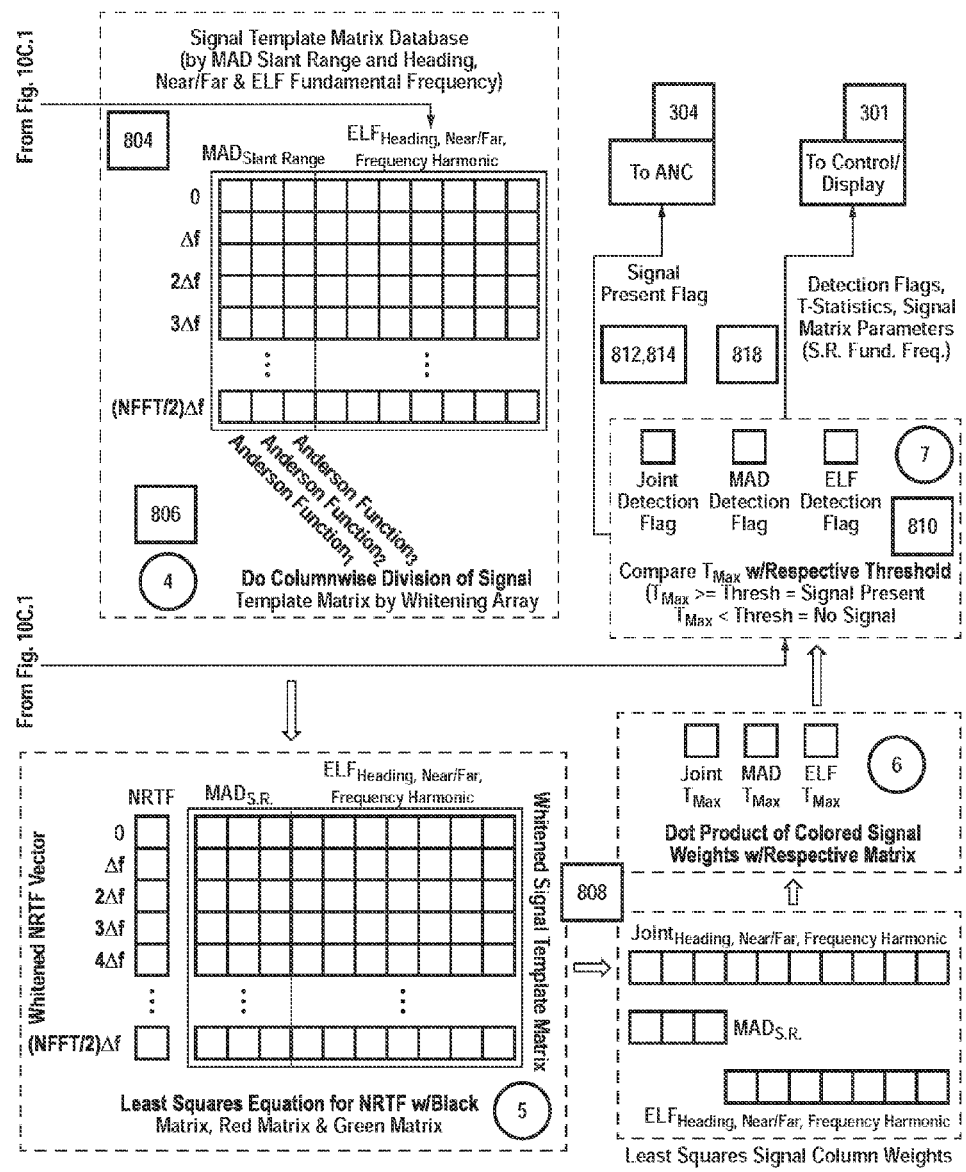
FIG. 10C.2

ENVIRONMENTAL NOISE REDUCTION FOR MAGNETOMETRY

GOVERNMENT RIGHTS

The United States Government may have certain rights in this application pursuant to one or more of: (1) U.S. Navy Contract No. N00014-07-C-0642 with the Office of Naval Research; (2) U.S. Navy Contract No. N00014-04-C-0612 with the Office of Naval Research; and (3) U.S. Navy Contract No. N00014-04-C-0062 with the Office of Naval Research.

TECHNICAL FIELD

The present disclosure relates generally to environmental noise reduction for magnetometry.

BACKGROUND

Magnetometry involves taking surveys of a portion of the surface of the Earth (or another body). Magnetic surveys are commonly conducted from airborne, sea surface, undersea and/or ground-based platforms. Such surveys are typically performed commercially for the oil, gas and mineral exploration industries by surveying companies that specialize in magnetometry. Airborne surveys are generally performed from either fixed wing aircraft or helicopters using scalar magnetometers (See, e.g., FIG. 1A (commercial magnetic survey aircraft 100 with three total field scalar magnetic sensors 102, 104 and 106), and 1B (military aircraft 108 with single total field scalar magnetic sensor 110)). Undersea surveys are generally performed by towing a sensor suite behind a boat or ship (See, e.g., FIG. 1C (sensor sled 112 with single total field scalar magnetic sensor 114 shown out of the water), and 1D (sensor sled 112 being towed through the water with the magnetic sensor submerged by at least some amount)). Ground-based surveys may be performed by towing a magnetically quiet cart behind a land vehicle (See, e.g., FIG. 1E (sensor cart 116 configured to be towed by a land vehicle)), with a push cart, or with a handheld or body-mounted sensor system (See, e.g., FIG. 1F (human-mounted magnetic sensor suite 118). Magnetic surveys are also performed in military applications to locate buried or submerged objects of interest such as buried explosive devices. The goal of such surveys is to find and locate magnetic anomalies which may be of interest. If the object of interest has moving metal parts, it may also emit alternating magnetic fields known as extremely low frequency emissions (ELFE) which magnetometers can also detect. In the mining and oil and gas industry it is known that certain types of rock formations with particular magnetic signatures can be a clue to nearby materials of interest. In archeology and environmental site remediation, buried iron and steel objects can be found. In the military certain magnetic signatures may indicate the presence of hostile underwater craft and buried unexploded ordnance, or explosive devices. Performing a magnetic survey typically involves moving the sensor suite over the various locations in a grid of interest. FIG. 1G illustrates a typical area of interest 120. The area is divided by horizontal and lateral raster scan lines 122, 124 over which the sensor suite will be carried by the platform to accomplish the survey. Depending upon the goals of the survey and the equipment being used, the distance between adjacent horizontal and lateral lines may be adjusted for best results as desired.

In the past such surveys have either been conducted in real time without significant efforts at real time noise reduction or they have been conducted with the benefit of offline noise reduction at the cost of several hours or days of additional time delay between the time of the survey and the receipt of the survey results. In military applications this delay will usually be considered undesirable and in commercial applications, while acceptable in certain circumstances, this approach gives one no opportunity for a mid-course correction, i.e., if the location appears wrong, or the equipment is not operating properly, the opportunity to go to another location or where useful data appears is or the opportunity to adjust or repair the equipment without carrying out a useless survey is not possible due to the delayed review of the survey results. This adds significant costs both in time and money.

A real time (e.g., survey results available reasonably quickly (seconds or minutes as opposed to hours) after measurements take place) noise reduction capability would be of great value to all parties interested in magnetometry.

Overview

In one embodiment a magnetic signal noise reduction and detection system has inputs configured to receive data from a first total field scalar magnetometer, data from a vector magnetometer, and data from a position, velocity and heading sensor, a signal processor configured with a pre-processor system, an adaptive noise cancellation system and a detection system, the pre-processor system configured to carry out initial processing of data received. The pre-processor is configured to convert data to the frequency domain and pass the converted data to the adaptive noise cancellation system. The adaptive noise cancellation system is configured to carry out multivariate regression on the converted data to reduce detected noise. The detection system is configured to detect magnetic anomalies and output information in real time about the magnetic anomalies to a user interface.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings:

FIG. 1A is an illustration of a commercial magnetometer survey airplane equipped with three total field magnetometers.

FIGS. 10A, 10B and 10C are flow diagrams illustrating the flow of data through the system in accordance with an embodiment of the present invention.

DESCRIPTION OF EXAMPLE EMBODIMENTS

Figure 1B:
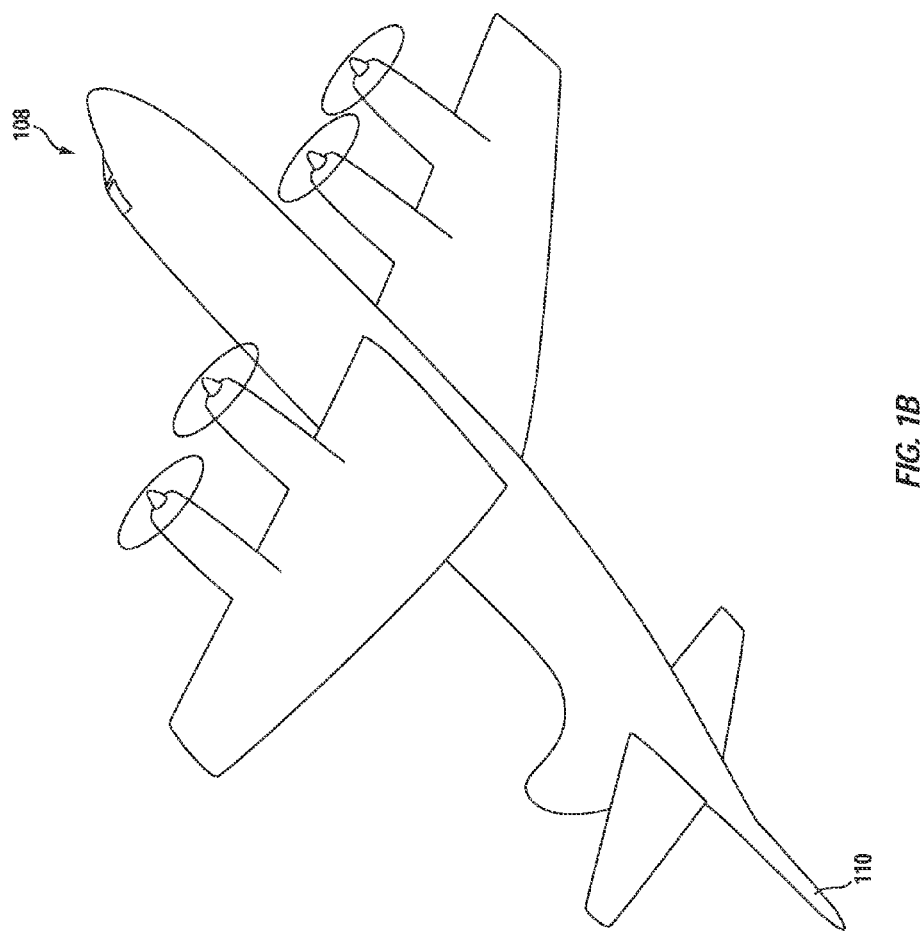
FIG. 1B is an illustration of a military airplane equipped with one total field magnetometer.
Figure 1C:
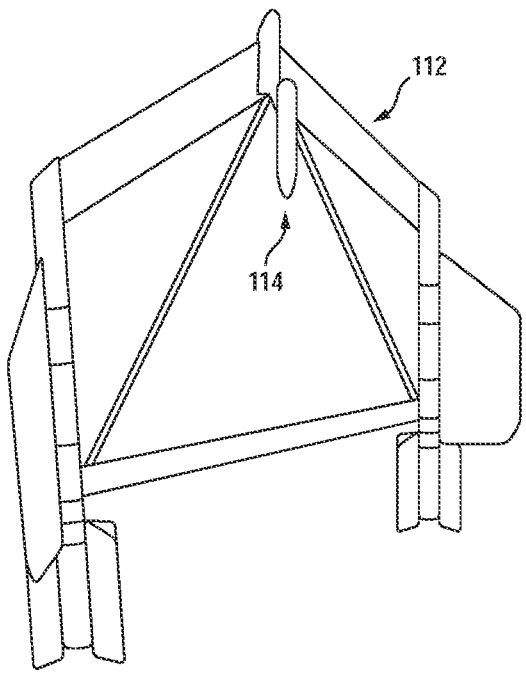
FIG. 1C is an illustration of a magnetometer towed sled for water use shown out of the water.
Figure 1D:
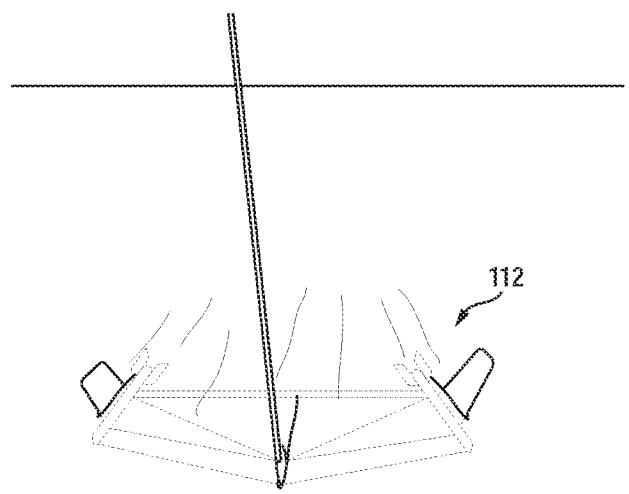
FIG. 1D is an illustration of a magnetometer towed sled for water use shown being towed through the water.
Figure 1E:
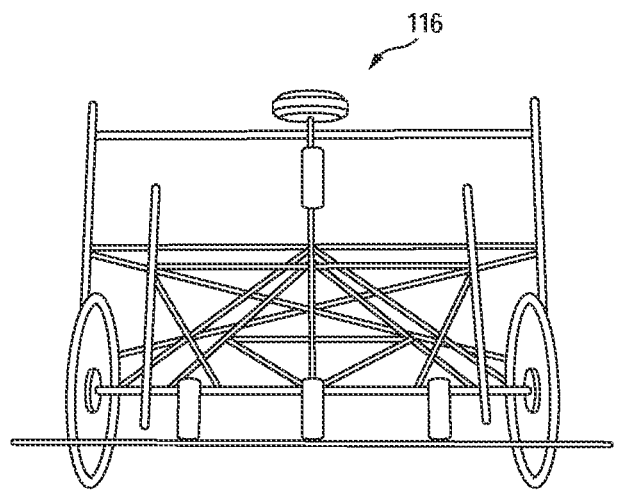
FIG. 1E is an illustration of a magnetometer towed sled for ground use.
Figure 1F:
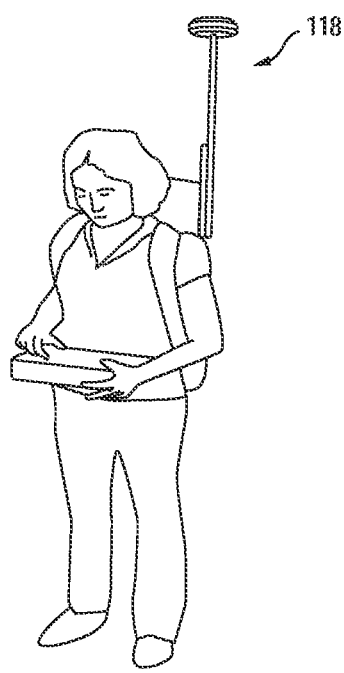
FIG. 1F is an illustration of a man-portable magnetometer system for ground use.
Figure 1G:
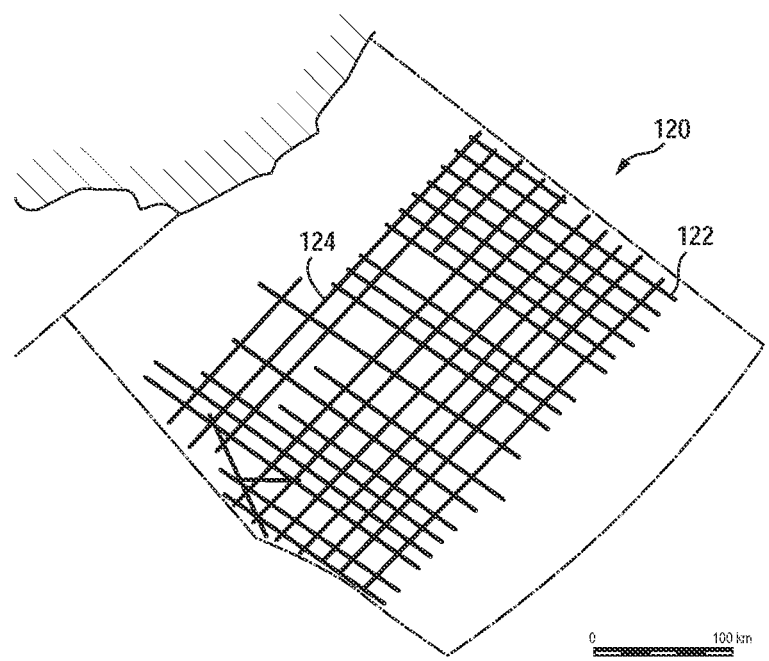
FIG. 1G is an illustration of an area of interest for magnetometer survey.

Example embodiments are described herein in the context of a system of computers, processors, servers, software and firmware performing environmental noise reduction and detection for magnetometry. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used to the extent possible throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Eraseable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

Some Abbreviations Used In The Disclosure

| | |
|---|---|
| ADC | Analog to digital converter |
| Al | Aluminum |
| ANC | Adaptive noise cancellation |
| Cu | Copper |
| DC | Direct Current |
| ELFE | Extremely low frequency (magnetic) emissions |
| ENRAD | Environmental Noise Reduction and Detection |
| Fe | Iron |
| FFT | Fast Fourier Transform |
| FIFO | First-in-first-out |
| GLLR | Generalized logarithmic likelihood ratio |
| GPS | Global Positioning System |
| IFFT | Inverse Fast Fourier Transform |
| MAD | Magnetic anomaly detection or magnetic anomaly |
| Ni | Nickel |
| PNR | Pendulum noise reduction |
| PSD | Power spectral density |
| RLS | Recursive least squares |
| SNR | Signal to noise ratio |
| SOS | Second Order Sections |
| T-statistic | Test statistic |
| UTF | Uncompensated total field |
| WAAS | Wide area augmentation system |

Magnetometry noise sources come from a number of phenomena. In this application the primary interest is in noise sources which distort the measurements taken by a primary total field scalar magnetometer. Such devices measure the total scalar magnetic field value at their position. As they are moved about, that value will change depending upon the noise sources, as well as the targets, e.g., moving the sensor array over a large deposit of Iron (Fe) or Nickel (Ni) would presumably present a large signal to the primary total field scalar magnetometer. Noise sources of primary interest include:

1. Sensor Noise.

Sensor noise is the magnetometer's "self noise" and is the upper bound on measurement capabilities and generally cannot be reduced or removed (except by improving the sensor in some way).

2. Buffeting Noise.

Surveying from any platform requires moving the platform containing the magnetic sensor suite over an area of interest—usually in some sort of grid or raster pattern so as to acquire data from a number of discrete areas. Movement of the sensor suite adds noise to the scalar total field measurement due to the interaction between the sensor and the Earth's gradient magnetic field. This noise source is referred to as "buffeting noise". Buffeting noise can be removed or reduced by use of vector magnetometer data along with positional (e.g., GPS) and velocity data.

3. Platform Noise

Platform noise is due to magnetic and conducting material within the platform itself—e.g., spinning motors with magnetic parts, navigation equipment, and magnetic and conducting metals which generate magnetic noise when the platform rotates in the Earth's magnetic field. Platform noise can be reduced by: (1) reducing the amount of magnetic materials (e.g., Ni, Fe) and conducting materials (e.g. Al, Cu) used in the platform itself; (2) adding magnetic shielding between the platform and the sensor; (3) providing some separation between the platform and the sensor; and (4) using vector magnetometer data to reduce the platform noise through the use of adaptive noise cancellation (ANC) techniques as described in more detail below.

4. Ocean Swell Noise

Ocean swell noise is caused by the magneto-hydrodynamic induction of ionized seawater in the Earth's constant geomagnetic field. This is primarily a problem for magnetometry near the ocean.

5. Ocean Internal Wave Noise

Internal wave noise is similar to ocean swell noise, but is caused by internal ambient waves below the surface of the ocean. This is also primarily a problem for magnetometry near the ocean.

6. Geomagnetic Noise

Geomagnetic noise is caused by the solar-activity induced disturbances in the Earth's magnetosphere. It varies on a daily and geographical basis. It is also affected by lightning activity around the world. It can be removed or reduced by the use of a second scalar magnetometer (reference magnetometer).

7. Geologic Noise

Geologic noise arises from the horizontal motion of a magnetic sensor across submerged concentrations of magnetic materials contained within or submerged below the seabed or ground. Geologic noise is not directly addressed by the noise reduction approach used herein because it requires two passes over the surveyed area and hence would preclude a real time solution. Where desired, this capability can be included by simply acquiring a first data set and then measuring the second data set and combing them in real time with the acquisition of the second data set so that real time performance is realized upon the second pass, if not the first.

8. Pendulum Noise

Pendulum noise is a unique source of noise caused by the motion of the magnetometer sensor suite when towed with a cable. This is often applicable in situations where the sensor suite is towed from a helicopter during airborne surveys. Pendulum noise may be reduced by using a pendulum noise reduction (PNR) algorithm which is operated in the time domain (as opposed to the frequency domain). The correlation channels are derived from some of the same sensors as are the ANC correlation channels.

Figure 2:
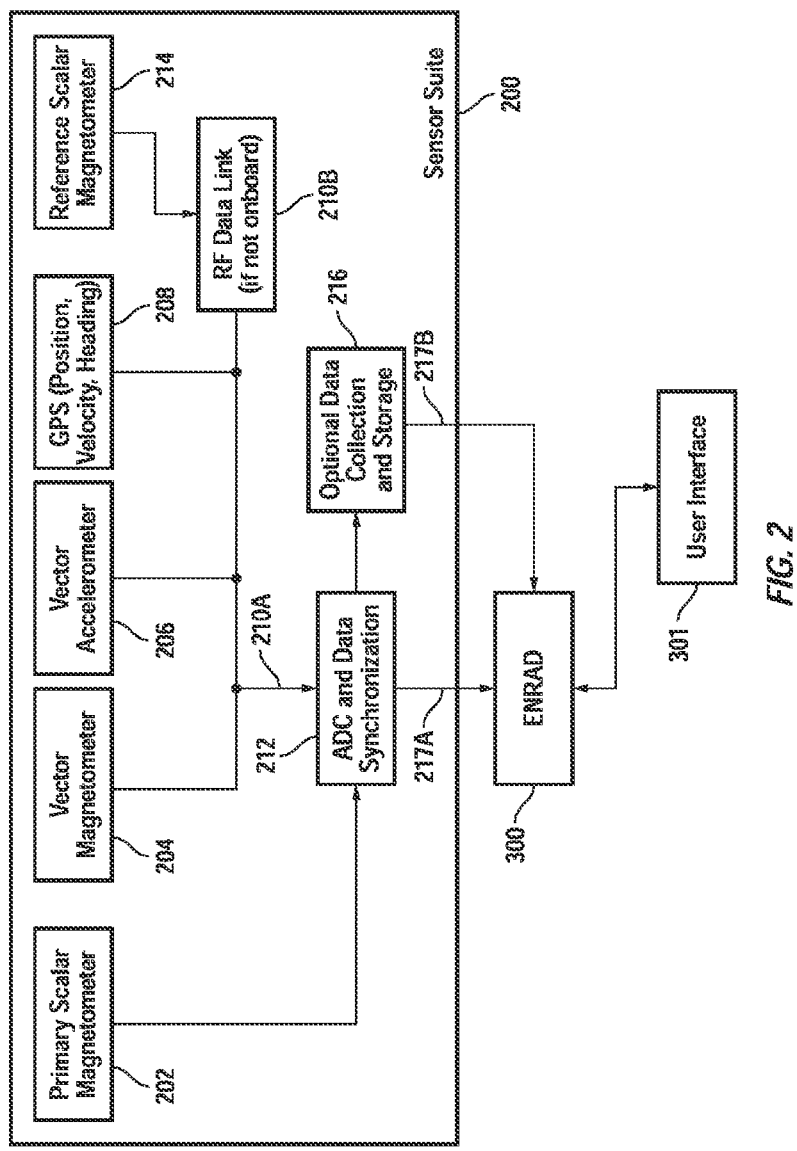
FIG. 2 is a block diagram of a sensor suite useable with the present invention.

FIG. 2 is a system block diagram illustrating one embodiment of a magnetic sensor survey suite 200 useable with the present invention. Sensor suite 200 includes a primary scalar total field magnetometer 202 which measures a scalar total magnetic field value present at its location. Vector magnetometer 204 measures the three axis components (e.g., x, y, z) of a magnetic field present at its location. Vector accelerometer 206 measures the three axis components (e.g., x, y, z) of acceleration of the platform to which it is mounted. Position, heading and velocity detector 208 (which may preferably be a Global Positioning Receiver (GPS) unit with Wide Area Augmentation Signal reception (WAAS) or a similarly provisioned device, provides position, velocity and heading information. Optional reference scalar magnetometer 214 is similar to primary scalar magnetometer 202. RF data link 210B is provided if the component 214 is located remote from the primary scalar magnetometer 202. Analog to digital converter (ADC) and data synchronizer 212 receive the data from the sensors 202, 204, 206, 208 and 214 via hardwired Data Link 210A, and optionally transmit the data for storage at memory store 216. Memory store 216 is ideally used as a backup storage in case of a problem. Data from the ADC and data synchronization block 212 is then transmitted to the pre-processor system 302 of the Environmental Noise Reduction and Detection (ENRAD) software system 300 (FIG. 3) (along data path 217A or optionally along data path 217B). Noise reduction operation is controlled through a user interface 301 which may optionally include a hard drive for storage, a display device, and other conventional input/output controls as traditional with such devices.

Examples of commercially available sensors usable with the present invention include: Total field scalar magnetometer, available from Polatomic, Inc. of Richardson, Tex., Model No. DT-704 (Laser Pumped He sensor technology); Total field scalar magnetometer, available from Geometrics, Inc. of San Jose, Calif., Models 822 A/B, 823 A/B, 824 A/B (Cesium sensor technology); Vector magnetometer, available from Billingsley Aerospace & Defense, Inc. of Germantown, Md., Model Nos. TFM100G2, TFM65-VQS and from Bardington in the United Kingdom (www.bardington.com), model Mag-03 MSL70; GPS Receiver-Antenna Assembly (for obtaining position information and acquiring velocity information), available from a number of vendors including NovAtel, Inc. of Calgary, Alberta, Canada, Model No. OEM4; and Vector Accelerometer, available from Analog Devices, Inc. of Norwood, Mass., Model Nos. ADXL202 (now superseded by ADXL203) and ADXL210. Other products are also believed to be suitable.

Noise Reduction

Noise in the signal from a primary total field magnetometer is reduced in real time or near real time through the use of coherent frequency domain noise cancellation signal processing from data collected simultaneously from auxiliary sensors. By providing a real time or near real time result interesting results may be followed-up immediately rather than by taking the data back to a data center for further processing and following up in days or weeks.

It is important to understand that the present invention is directed to a system, method and apparatus and may be implemented with hardware, software, firmware or, more likely, some combination of the three. All of the auxiliary sensors described herein are not required. At a minimum the requirements are a primary scalar magnetometer, a vector magnetometer and a position sensor. Additional sensors such as additional scalar magnetometers, current meters, pressure meters, altimeters and the like may also be used to provide additional inputs for the noise reduction processing and thus improve the results of the noise reduction process.

System Design

Figure 3:
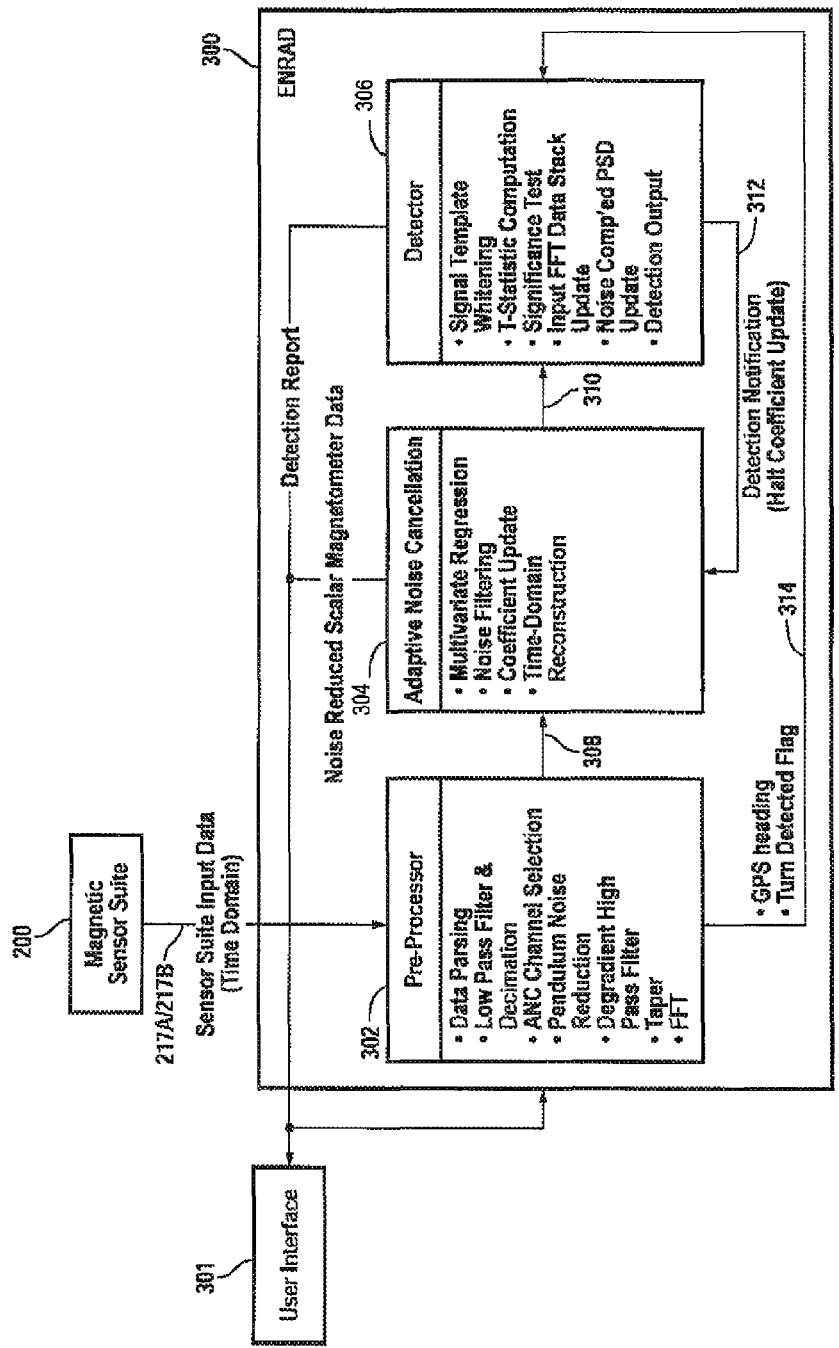
FIG. 3 is a block diagram illustrating key components of an environmental noise reduction system for magnetometer data in accordance with an embodiment of the present invention.

FIG. 3 is a system block diagram of a noise reduction system 300 in accordance with an embodiment of the present invention. It includes three major components: the pre-processor system 302, the ANC system 304, and the detector system 306. Data from the sensor suite 200 is routed to the noise reduction system 300 over line 217A/217B where it is received by the pre-processor system 302. Data from the pre-processor system 302 is then sent to the ANC system 304 on line 308. The noise compensated data from the ANC system 304 is then sent to detector system 306 on line 310. The detection report is fed back to ANC system 304 on line 312, and optionally out to the user interface 301. Pre-processor system 302 carries out data parsing (FIG. 4: 402), low pass filtering and decimation (404), ANC channel selection (406), PNR (410) (performed in the time domain rather than the frequency domain), high-pass spectrum equalizing filtering (412) to approximately whiten and reduce fast Fourier transform (FFT) side lobes, tapering to also reduce FFT side lobes and then performs an FFT (414) of the pre-processed data prior to transmission to the ANC system 304 over line 308. Heading information and a turn detection flag are passed over line 314 from the pre-processor system 302 to the detector system 306.

Figure 4:
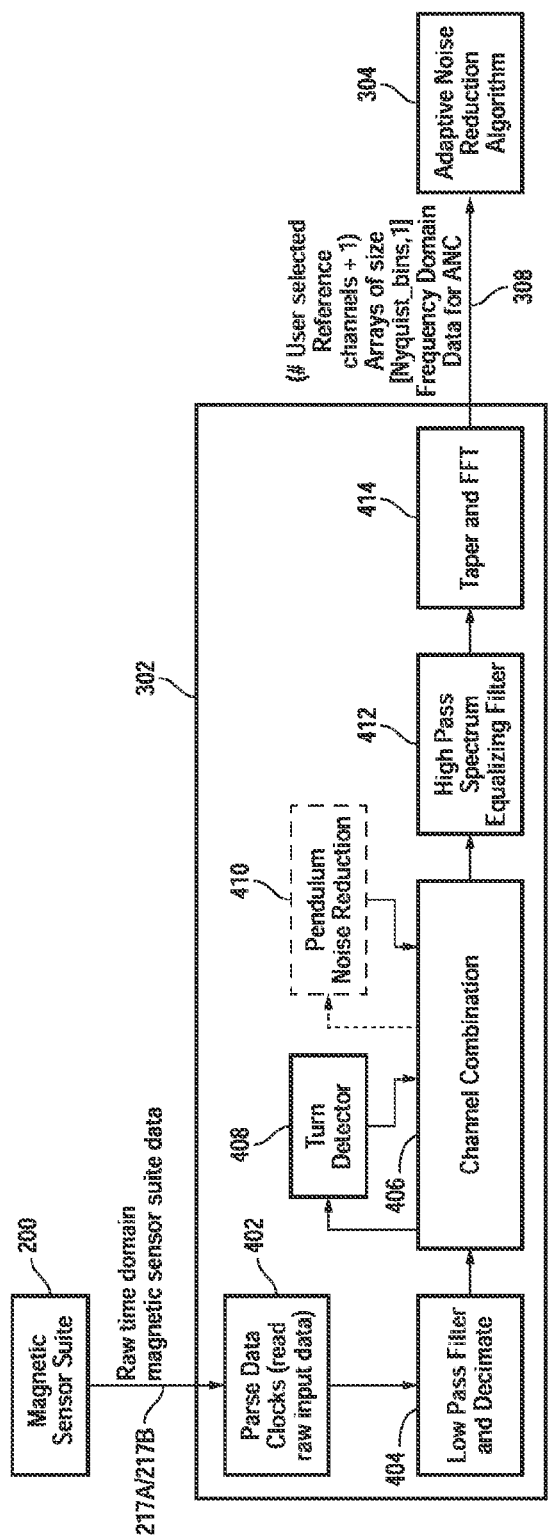
FIG. 4 is a flow diagram illustrating operation of the pre-processor section of the environmental noise reduction system shown in FIG. 3.

FIG. 4 is a system block diagram of the pre-processor system 302. The pre-processor system 302's primary role is to convert the raw data from a specified input format into a form that the larger ENRAD system can readily operate on. In one embodiment this is a collection of "C" computer language variables for the noise reduction algorithms to operate on. The raw data is time domain data from a given number of sensors that comprise the magnetic sensor suite. The raw data values can be combined to create "channels" of data for the ANC algorithms to operate on in the frequency domain. There is some signal processing executed in software to condition the time series "channels" in order to increase the effectiveness of the noise cancellation algorithms. The PNR algorithm is primarily for use with towed magnetic sensor suites as discussed above and is therefore optional.

Figure 5:
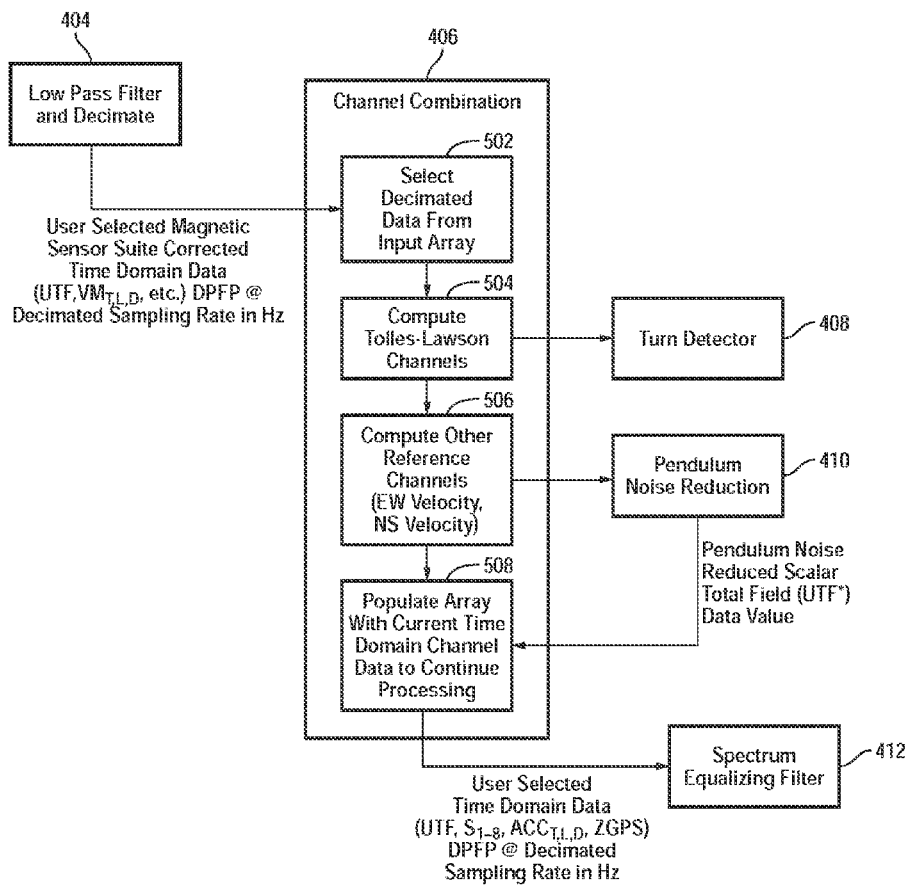
FIG. 5 is a flow diagram illustrating operation of the channel combination section of the pre-processor section shown n FIG. 4.

FIG. 5 is a system block diagram of the functional operation of the channel combination block 406 of FIG. 4. The channel combination block 406 computes and loads the different channels selected by an operator or user of the system for further processing in preparation for delivery to the ANC system 304. The channel combination block 406 receives data from block 404 and combines vector magnetometer channels to yield Tolles-Lawson signals for both search and or reference sensors if desired. The total field magnetometer channel is not used in construction of the Tolles-Lawson signals due to potential periods of magnetometer loss of lock corrupting these channels, or to prevent removal of a magnetic anomaly detection (MAD) signal or ELFE detection signal. At block 502 decimated data from the input array is selected and output to block 504. At block 504 that data is used to compute Tolles-Lawson channels in a conventional manner which are forwarded to a Turn Detector which yields turn indication (forwarded to block 408) before being forwarded to block 506 where other reference channels are calculated (e.g., North-South velocity and East-West velocity). That data is forwarded to block 508 where a data array is populated with current time domain channel data to continue processing. Block 506 also feeds data to the PNR block 410 which feeds results (pendulum noise reduced uncompensated scalar total field data values) back to block 508. The output of block 406 is forwarded to block 412—a spectrum equalizing filter.

Figure 6:
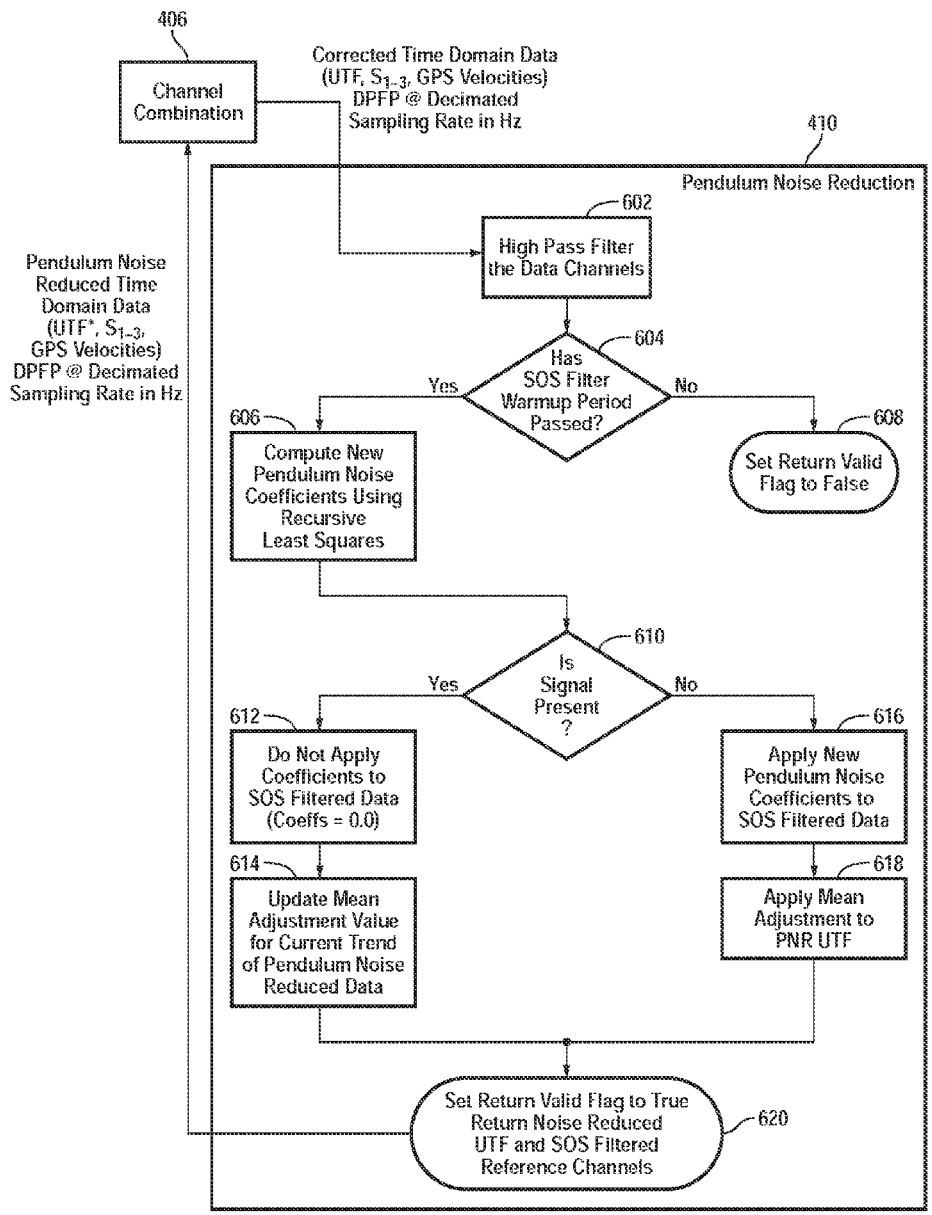
FIG. 6 is a flow diagram illustrating operation of the pendulum noise reduction section of the pre-processor section shown in FIG. 4.

FIG. 6 is a flow diagram of the functional operation of the PNR block 410. The PNR block 410 is used by the channel combination block 406 and is optional and primarily useful with towed sensor suites. If the sensor suite is mounted to a rigid body, such as an airframe, then this block is not needed and may be bypassed. The PNR algorithm is similar to the ANC algorithm in that it uses a RLS algorithm to update the PNR coefficients; however, all data is time domain data. There is no guard buffer for this algorithm.

Block 410 receives its data from channel combination block 406. At block 602 the data is high-pass filtered. At block 604 if the second order sections (SOS) filter warm-up period has expired control transfers to block 606, otherwise control transfers to block 608 where a flag (Return Valid=FALSE) is set and the system continues to wait for the warm-up period to expire. At block 606 new pendulum noise coefficients are calculated using the RLS method. Control then passes to block 610. If a signal is determined to be present, control passes to block 612, otherwise to block 616. At block 616 the new pendulum noise coefficients are applied to SOS filtered data, control passes to block 618 where mean adjustments are applied to PNR uncompensated total field (UTF) channel and control passes to block 620. At block 612 the PNR coefficients are NOT applied to the SOS filtered data, and at block 614 the mean adjustment value for current trend of pendulum noise reduced data is updated. Control then passes to block 620 where the Return Valid flag is set to TRUE and the noise reduced UTF and SOS filtered reference channels are sent back to channel combination block 406.

Turning back to FIG. 3, the ANC system 304 receives data from the pre-processor system 302 along with detection notification from the detector system 306 through pointer variables passed though a software function call. It performs adaptive frequency domain multivariate regression to update noise coefficients, perform noise filtering, and perform time-domain reconstruction.

The adaptive noise cancellation system 304 has the primary role of performing a least squares estimation of the noise through correlation of the conditioned scalar total field with the conditioned reference channels per frequency bin. The updating of coefficients is implemented using a recursive least squares algorithm per frequency bin. The ANC algorithm features a guard buffer and support variables to control what data segments are used for updating the noise coefficients in the recursive least squares algorithm. The guard buffer support variables can be updated until either the data is used or discarded.

Figure 7:
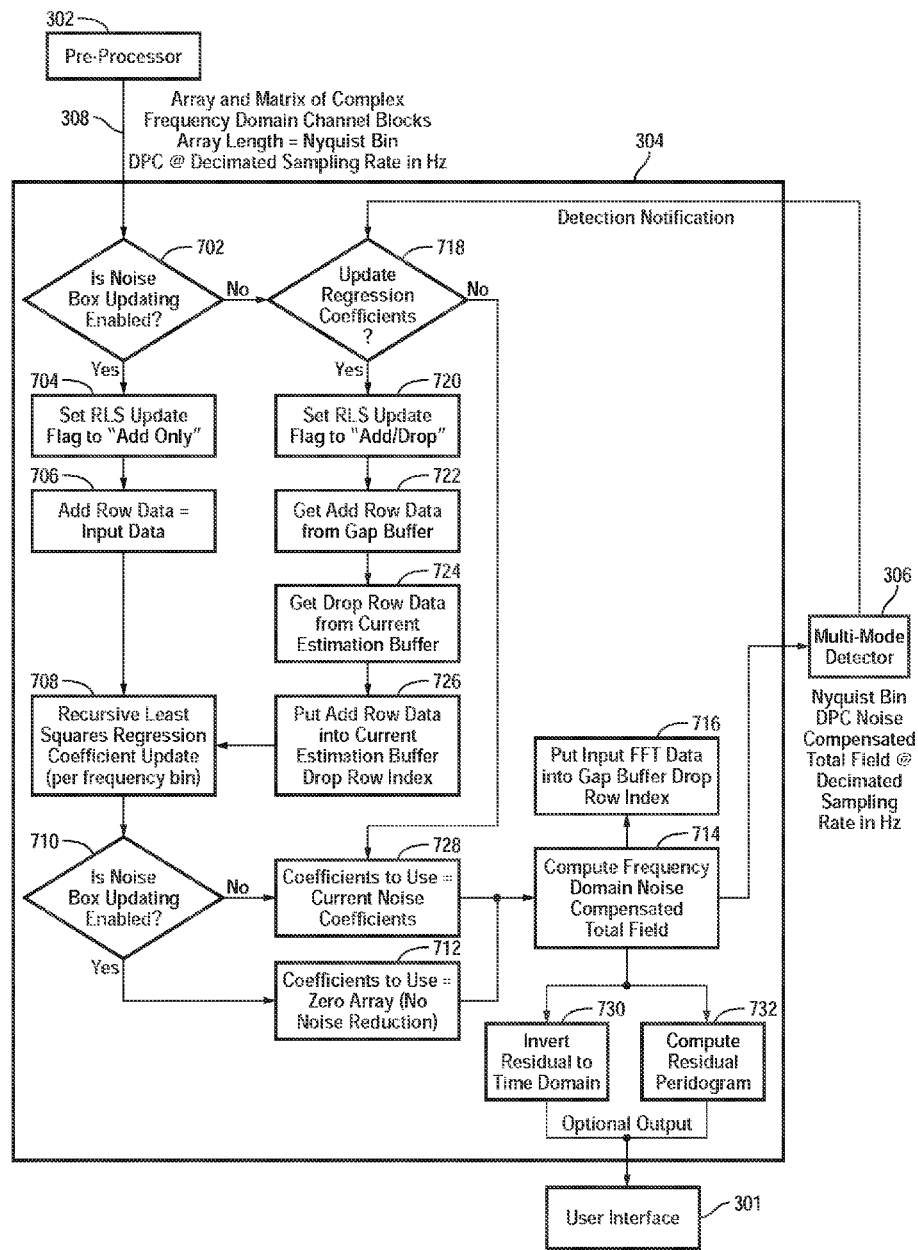
FIG. 7 is a flow diagram illustrating operation of the adaptive noise cancellation section of the environmental noise reduction system shown in FIG. 3.

FIG. 7 is a process flow diagram illustrating operation of the ANC system 304. The ANC system 304 checks the current operational mode 702 of the system per direction from control and display block 301 as it receives data from pre-processor 302 over line 308. When the system is in "Noise Box" mode at block 704 the RLS configuration flag is set to "add only" mode at block 704. Continuous updating of the estimation history is performed at blocks 706/708. The updated noise reduction coefficients and correlation matrices are stored; however, the coefficients are not used (712) and no signal is removed (714) (when "Noise Box" mode is enabled). When "Noise Box" mode is disabled, a scaling parameter is applied to the finite noise box estimation history to make the "normal" mode finite estimation data history equally weighted. During "normal" update mode the ANC algorithm checks to see whether there is a signal present, or whether there is unwanted data for adding to the coefficient estimation (718). If the data is good then the RLS algorithm (708) configuration flag is set to "add/drop" (720) and the RLS algorithm uses a finite history length for estimation. The data to be brought into the finite estimation window (block 722) is taken from the oldest position in the circular gap buffer window. The data to be removed from the finite estimation window (block 724) is taken from the oldest position in the finite history circular buffer. The oldest gap buffer data is then stored (block 724) in the oldest 724 finite history buffer position 726. The RLS algorithm 708 updates the noise coefficients and correlation matrices with the data from 720, 722, and 724. The new noise coefficients 728 are then used to compute the compensated total field 714 to be sent to the detector system 306. Optional calculation of the current time series data point 730 (midpoint of the IFFT window) can be calculated and sent to the command and display 301 along with the compensated total field's periodogram 732. The input data is then put into the gap buffers' oldest position 716.

Figure 9:
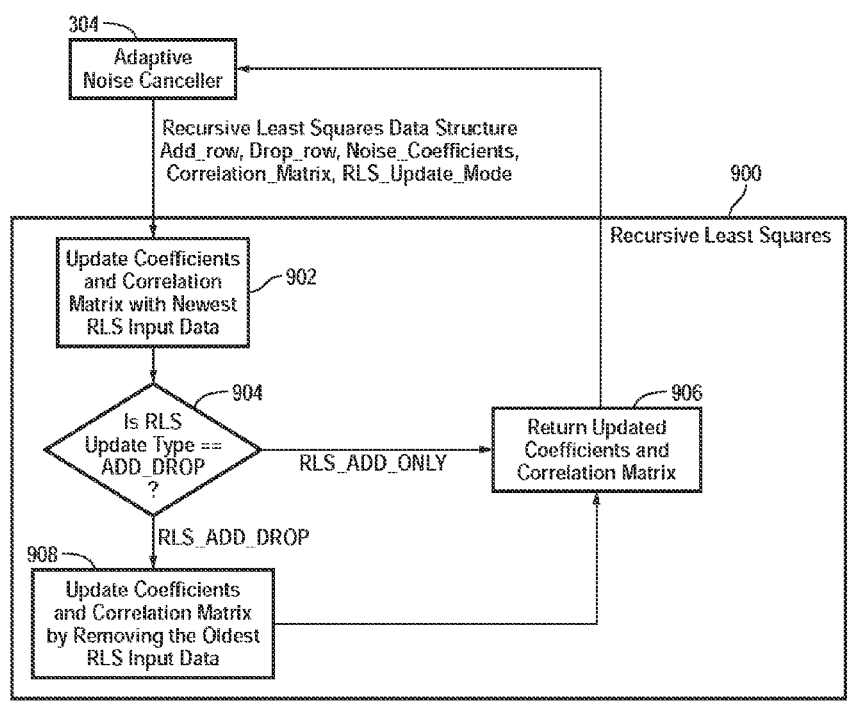
FIG. 9 is a flow diagram illustrating operation on a recursive least squares data structure in accordance with an embodiment of the present invention.

FIG. 9 is a process flow diagram of a recursive least squares (RLS) process 900 used in accordance with one embodiment to update the coefficients whenever the adaptive noise cancellation function is used. The recursive least squares correlation matrix for each frequency, has the diagonal elements set to a predetermined value in order to prevent errors during the update process. When the noise box data collection mode is enabled the recursive least squares only adds the current data to the estimation window 902. In "normal" mode the oldest row of data from the estimation window is removed after the new data has been added in. At block 904 the status flag is checked to see if the RLS being performed is of the "add-only" type (in which case transfer to block 906) or the "add/drop" type (in which case transfer to block 908. At block 908 coefficients are updated along with the correlation matrix by removing the oldest RLS input data. At block 906 updated coefficients and correlation matrix are passed back to the calling routine in the ANC system 304.

Turning back to FIG. 3, the detector system 306 implements a generalized logarithmic likelihood ratio (GLLR) detector for a colored Gaussian signal in the presence of colored Gaussian noise. It estimates the noise statistics by computing and updating a PSD of the noise cancelled data from ANC system 304 and applies the PSD to both the data and the signal templates in the one whitened method of preparing for a GLLR. The GLLR test statistic (T-statistic) is computed in the standard way in the Fourier domain and the T-statistic mean and variance are computed and updated to provide a significance test for the T-statistic. The significance is reported as a detector signal-to-noise-ratio (SNR). When a detection is declared a notification is provided over line 312 back to ANC system 304 to halt coefficient updating upon detection of a MAD or ELFE signal. This prevents the detected (MAD or ELFE) signal from contaminating the noise estimates in the ANC system 304.

Figure 8:
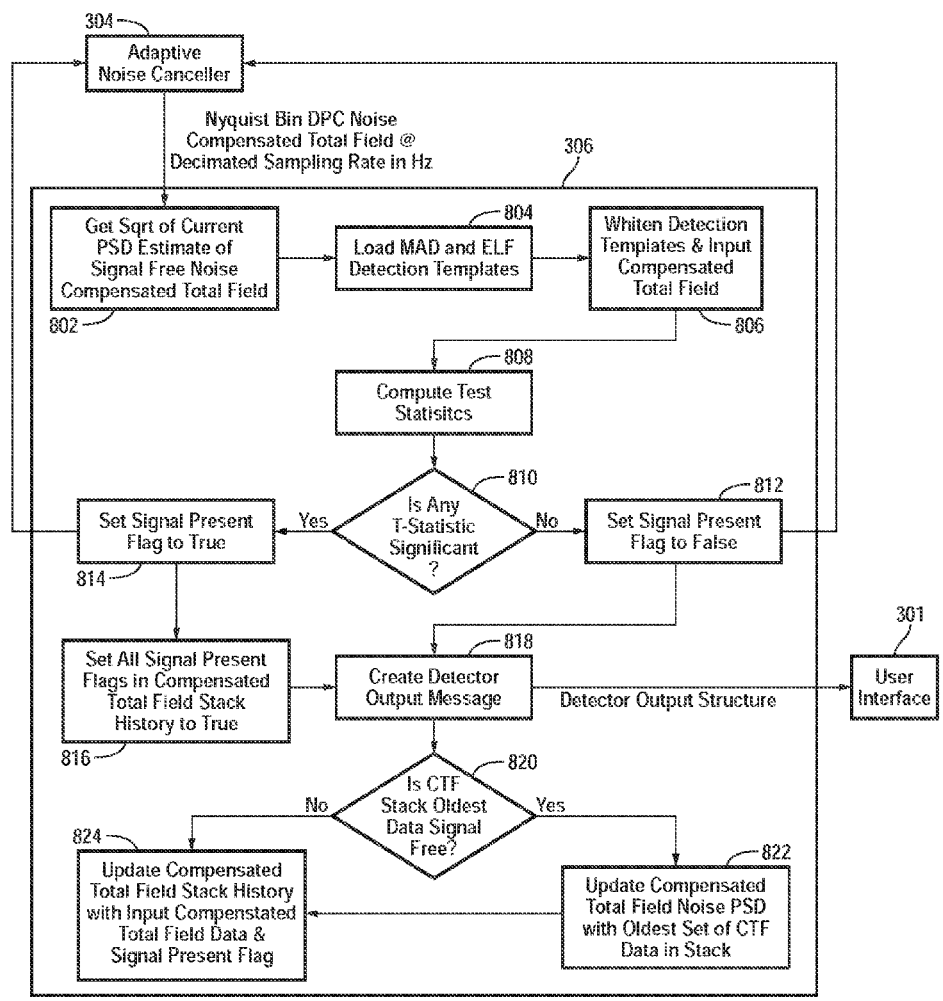
FIG. 8 is a flow diagram illustrating operation of the detection section of the environmental noise reduction system shown in FIG. 3.

Turning to FIG. 8, the primary role of detector system 306 is to estimate the likelihood that the current window of data (a number of FFT bins in length) contains a MAD or ELFE signal (or both together). Block 306 receives data at block 802 from ANC system 304. At block 802 the square root of the current PSD estimate of signal-free noise compensated total scalar magnetic field is determined. That is passed to block 804 where MAD and ELFE detection templates are loaded. At block 806 the detection templates and input compensated total field are whitened. At block 808 T-statistics are computed. At block 810 if any T-statistic is significant then the "signal present" flag is set to TRUE, that flag is passed to block 304 and control passes to block 816. Otherwise the "signal present" flag is set to FALSE at block 812, that flag is passed to block 304 and control passes to block 818. At block 816 all "signal present" flags in the compensated total field stack history are set to TRUE and control passes to block 818. At block 818 a message output is prepared and forwarded to the user interface 301. Control passes to block 820 where if the oldest window of compensated total field data in the compensated total field stack has its "signal present" flag set to TRUE (i.e., is not free of MAD or ELFE signal) control passes to block 824. Otherwise control passes to block 822 where the compensated total field noise PSD is updated with the oldest set of compensated total field data in the stack. The control passes to block 824 where the compensated total field stack history is updated with the input compensated total field data and "signal present" flag.

Turning now to FIGS. 10A, 10B and 10C, FIG. 10A provides a detailed flow diagram of the input data from the magnetic sensor suite 200 as it goes through the pre-processor system 302. The data goes from the sensor suite 200 into the preliminary data cracker 402. The data is then sent to the low pass filter and decimation routine 404. The decimated data then goes to the channel selection subroutine 406 where the Tolles-Lawson channels are calculated from the vector magnetometer channels. The first 3 Tolles-Lawson channels are sent to the turn detector 408 (not shown in FIG. 10A). If the PNR algorithm 410 is enabled the uncompensated scalar total field and user selected PNR channels (Tolles-Lawson channels 1-3, GPS Vertical Velocity, and/or GPS Horizontal Velocity) are passed into 410 to calculate the pendulum noise reduced scalar total field. If the PNR algorithm 410 is enabled then the pendulum noise reduced scalar total field and user selected ANC channels are sent to the spectrum equalizing high pass filter subroutine (412). If the PNR algorithm 410 is not enabled, then the decimated scalar total field and user selected ANC channels are sent to the spectrum equalizing filter subroutine (412). The spectrum equalizing filter subroutine (412) output is then used to update the FIFO buffers needed to compute the FFT at block 414. The positive frequencies (DC through Nyquist bins) are then sent to the ANC system 304.

FIG. 10B is a conceptual figure of the current estimation history and gap buffer, and shows how the data flows through while in the "normal" processing mode. The pre-processor 302 FFT data from block 414 is sent to ANC system 304. When the oldest data in the gap buffer is error free and signal free (718) then that data is used for updating the RLS (708) as was noted in FIG. 7 (722). The oldest data in the finite length current estimation window (724) is set as the down-dating data for removal at block 908 of FIG. 9. The updating data from the gap buffer (722) overwrites the finite estimation window's oldest data (726). The RLS subroutine (708) is passed the new data to "add" at block 722 and the old data to "drop" at block 724 and returns the updated noise reduction coefficients. These coefficients are then set as the current noise coefficients to apply (728) to calculate the compensated total field (714). These steps are performed over each frequency bin from DC to Nyquist. After the noise compensated total field has been calculated (714), the input data from the pre-processor 302 (414) replaces the oldest data in the gap buffer (716). FIG. 10B steps 3 and 6 are implemented using circular indexing so that blocks of data don't actually get shifted around.

FIG. 10C contains a data flow diagram for the detector system's 306 detection algorithm. The noise compensated total field is received from the ANC system 304 after noise compensation (714) has completed. The detector 306 also receives the heading information from the pre-processor 302 and also the "turn" flag (408). When the detector 306 receives the noise compensated total field from the ANC system 304, the decimated sampling rate time step scalar value multiplies each element of the noise reduced total field. The current value of the noise compensated total field PSD estimate is multiplied by the frequency bin width scalar value then the square root is calculated for each element (802). The MAD signal templates, comprised of the three Anderson Functions for each slant range in the template library/database, are whitened by element-wise division of the square root of the PSD (802). The ELFE signal templates for the given heading value (804) are also whitened by point-wise division of the square root of the PSD (802). The noise compensated total field with the attached units is then whitened by element-wise division of the square root of the PSD (802) thus completing the whitening process (806). The whitened data is then sent to block 808 to compute and find the maximum T-statistic for a given combination of slant range and fundamental frequency. The joint statistic (comprised of a MAD+ELFE signal) is estimated by calculating the signal template column weights by obtaining a least squares solution. The least squares matrix is composed of the whitened MAD and whitened ELFE signal templates for the given parameters, and the estimated vector is the whitened compensated total field. The same method is used to compute the MAD-only and ELFE-only T-statistics. The least squares matrix is composed of the subset of the whitened MAD signal template or the whitened ELFE signal template only. The signal strength weights are then multiplied with the respective whitened signal template matrix. The resulting vector is then summed to produce the respective T-statistic (joint, MAD-only, or ELFE-only). The respective T-statistics are then compared against their respective thresholds (810). Any T-statistic in excess of the threshold is defined as a "detection" (and the "detection" flag is set to TRUE) (814), otherwise the "signal" flag is set to FALSE indicating no detection (812). When the signal "detection" flag is TRUE, all elements of the compensated total field data stack have their "detection" flags set to TRUE (816) to prevent it from being used in updating the PSD. A detection report is then constructed AT BLOCK 818 and sent to the user interface 301. The signal "detection" flag is sent to the ANC algorithm 304 to notify it of the presence of a signal detection in order to prevent that data from being used in the estimation of the noise coefficients. The oldest set of noise-compensated total field values from the detector 306 gap buffer are then checked to see if they are permitted for updating the noise compensation PSD (820). If that data is valid for PSD updating, that data is sent to the PSD update routine (822). Finally, the compensated total field data is written into the detector 306's gap buffer's oldest position 824.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. A magnetic signal noise reduction and detection system, comprising:
   an input configured to receive data from a first total field scalar magnetometer;
   an input configured to receive data from a vector magnetometer;
   an input configured to receive data from a position, velocity and heading sensor;
   a signal processor configured with a pre-processor system, an adaptive noise cancellation system and a detection system, the pre-processor system configured to carry out initial processing of data received from the first total field scalar magnetometer, the vector magnetometer and the position, velocity and heading sensor;
   the pre-processor configured to convert data derived from the first total field scalar magnetometer, the vector magnetometer and the position, velocity and heading sensor to the frequency domain and pass the converted data to the adaptive noise cancellation system;
   the adaptive noise cancellation system configured to carry out multivariate regression on the converted data in order to reduce detected noise; and
   the detection system configured to detect magnetic anomalies and output information in real time about the magnetic anomalies to a user interface.

2. The system according to claim 1, further comprising:
   a pendulum noise reduction module associated with the pre-processor system configured to carry out pendulum noise reduction in the time domain.

3. The system according to claim 1, further comprising:
   an input configured to receive data from a second total field scalar magnetometer.

4. The system according to claim 1, further comprising:
   a data storage system associated with the adaptive noise cancellation system and configured to receive and store a series of data from the adaptive noise cancellation system, the data storage system further coupled to the detection system to receive signals indicative of the detection of a magnetic anomaly and further configured not to store data associated with a detected magnetic anomaly.

5. The system according to claim 1, wherein the magnetic anomalies may be magnetic anomaly detections and extremely low frequency magnetic emissions.

6. The system according to claim 2, further comprising:
   an input configured to receive data from a second total field scalar magnetometer.

7. The system according to claim 2, further comprising:
   a data storage system associated with the adaptive noise cancellation system and configured to receive and store a series of data from the adaptive noise cancellation system, the data storage system further coupled to the detection system to receive signals indicative of the detection of a magnetic anomaly and further configured not to store data associated with a detected magnetic anomaly.

8. The system according to claim 2, wherein the magnetic anomalies may be magnetic anomaly detections and extremely low frequency magnetic emissions.

9. A method for signal noise reduction and detection system, comprising:
   receiving a data input from a first total field scalar magnetometer;
   receiving a data input from a vector magnetometer;
   receiving a data input from a position, velocity and heading sensor;
   processing the received data inputs with a signal processor configured with a pre-processor system, an adaptive noise cancellation system and a detection system, the pre-processor system configured to carry out initial processing of data received from the first total field scalar magnetometer, the vector magnetometer and the position, velocity and heading sensor, the pre-processor configured to convert data derived from the first total field scalar magnetometer, the vector magnetometer and the position, velocity and heading sensor to the frequency domain and pass the converted data to the adaptive noise cancellation system, the adaptive noise cancellation system configured to carry out multivariate regression on the converted data in order to reduce detected noise, and the detection system configured to detect magnetic anomalies; and
   outputting in real time data about detected magnetic anomalies to a user interface.

10. The method according to claim 9, further comprising:
    carrying out pendulum noise reduction in a module associated with the pre-processor system in the time domain.

11. The method according to claim 9, further comprising:
    receiving a data an input from a second total field scalar magnetometer.

12. The method according to claim 9, further comprising:
    storing data received from the adaptive noise cancellation system that is not associated with a detected magnetic anomaly.

13. The method according to claim 9, wherein the magnetic anomalies may be magnetic anomaly detections and extremely low frequency magnetic emissions.

14. The method according to claim 10, further comprising:
    receiving a data an input from a second total field scalar magnetometer.

15. The method according to claim 10, further comprising:
    storing data received from the adaptive noise cancellation system that is not associated with a detected magnetic anomaly.

16. The method according to claim 10, wherein the magnetic anomalies may be magnetic anomaly detections and extremely low frequency magnetic emissions.

17. A system, comprising:
- a vehicle;
- a magnetic sensor suite, at least some of which is physically coupled to the vehicle;
- the magnetic sensor suite including at least a first total field scalar magnetometer, a vector magnetometer, and a position, velocity and heading sensor;
- a user interface;
- a magnetic noise reduction and detection system including:
  - an input configured to receive data from the first total field scalar magnetometer,
  - an input configured to receive data from the vector magnetometer,
  - an input configured to receive data from the position, velocity and heading sensor;
  - a signal processor configured with a pre-processor system, an adaptive noise cancellation system and a detection system, the pre-processor system configured to carry out initial processing of data received from the first total field scalar magnetometer, the vector magnetometer and the position, velocity and heading sensor;
  - the pre-processor configured to convert data derived from the first total field scalar magnetometer, the vector magnetometer and the position, velocity and heading sensor to the frequency domain and pass the converted data to the adaptive noise cancellation system;
  - the adaptive noise cancellation system configured to carry out multivariate regression on the converted data in order to reduce detected noise; and
  - the detection system configured to detect magnetic anomalies and output information about the magnetic anomalies to the user interface.

18. The system according to claim 17, further comprising:
- a pendulum noise reduction module associated with the pre-processor system configured to carry out pendulum noise reduction in the time domain.

19. The system according to claim 17, further comprising:
- a data storage system associated with the adaptive noise cancellation system and configured to receive and store a series of data from the adaptive noise cancellation system, the data storage system further coupled to the detection system to receive signals indicative of the detection of a magnetic anomaly and further configured not to store data associated with a detected magnetic anomaly.

* * * * *